(12) United States Patent  
Suzuki (10) Patent No.: US 9,167,702 B2  
(45) Date of Patent: Oct. 20, 2015

(54) METHOD OF MANUFACTURING WIRING SUBSTRATE HAVING BUILT-IN COMPONENT

(71) Applicant: NGK SPARK PLUG CO., LTD., Nagoya, Aichi (JP)

(72) Inventor: Kenji Suzuki, Iwakurai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 183 days.

(21) Appl. No.: 13/626,477

(22) Filed: Sep. 25, 2012

(65) Prior Publication Data

US 2013/0074332 A1 Mar. 28, 2013

(30) Foreign Application Priority Data

Sep. 28, 2011 (JP) ................................. 2011-212967

(51) Int. Cl.
*H05K 3/30* (2006.01)
*H05K 1/18* (2006.01)
(Continued)

(52) U.S. Cl.
CPC ................ *H05K 3/306* (2013.01); *H05K 1/185* (2013.01); *H05K 3/0094* (2013.01); *H05K 3/4602* (2013.01); *H01L 2224/16225* (2013.01);
(Continued)

(58) Field of Classification Search
USPC ............. 29/25.41, 592.1, 832, 842, 847, 852; 174/260, 250; 257/700, 723; 361/321.1, 760, 761, 763
See application file for complete search history.

(56) References Cited

U.S. PATENT DOCUMENTS 5,353,195 A * 10/1994 Fillion et al. .................. 361/760
6,876,554 B1 * 4/2005 Inagaki et al. ................ 361/763
(Continued)

FOREIGN PATENT DOCUMENTS

JP   H08-78842 A    3/1996
JP   2000-022339 A  1/2000
(Continued)

OTHER PUBLICATIONS

Japanese Patent Office, Notification of Reason for Rejection issued in corresponding Japanese application No. 2011-212967, dispatched Aug. 26, 2014.
(Continued)

*Primary Examiner* — Paul D Kim
(74) *Attorney, Agent, or Firm* — Stites & Harbison, PLLC; Jeffrey A. Haeberlin; James R. Hayne (57) ABSTRACT

A method of manufacturing a component-built-in wiring substrate which exhibits excellent reliability, through improvement of adhesion between a resin filler and a core substrate, is provided. In some embodiments the method comprises a core substrate preparation step for preparing a core substrate, an accommodation-hole forming step for forming an accommodation hole in the core substrate, and a through-hole forming step for forming through-holes. In a plating-layer forming step, a plating layer is formed on an inner wall surface of the accommodation hole and plating layers are formed on the inner wall surfaces of the through-holes, which become through-hole conductors each having a hollow. In an accommodation step, a component is accommodated in the accommodation hole. In a resin charging step, a resin filler is filled into a gap between component side-surfaces and the inner wall surface of the accommodation hole and into the hollows.

8 Claims, 7 Drawing Sheets

(51) Int. Cl.
*H05K 3/46* (2006.01)
*H05K 3/00* (2006.01)
*H05K 1/02* (2006.01)

(52) U.S. Cl.
CPC . *H01L2924/1461* (2013.01); *H01L 2924/1531* (2013.01); *H05K 1/0218* (2013.01); *H05K 1/0222* (2013.01); *H05K 2201/0187* (2013.01); *H05K 2201/0959* (2013.01); *H05K 2201/09536* (2013.01); *H05K 2201/09981* (2013.01); *H05K 2201/10712* (2013.01); *H05K 2203/1394* (2013.01); *Y10T 29/49133* (2015.01)

(56) References Cited

U.S. PATENT DOCUMENTS

| | | | |
|---|---|---|---|
| 8,183,465 | B2 | 5/2012 | Suzuki et al. |
| 8,466,372 | B2 * | 6/2013 | Sakai et al. ............... 174/260 |
| 2005/0157478 | A1 * | 7/2005 | Inagaki et al. ............ 361/763 |
| 2008/0041619 | A1 * | 2/2008 | Lee et al. ................. 174/260 |
| 2008/0055872 | A1 * | 3/2008 | Inagaki et al. ............ 361/760 |
| 2008/0115349 | A1 * | 5/2008 | Kim et al. ................. 29/830 |
| 2008/0158838 | A1 * | 7/2008 | Inagaki et al. ............ 361/761 |
| 2008/0158841 | A1 * | 7/2008 | Inagaki et al. ............ 361/782 |
| 2010/0078205 | A1 * | 4/2010 | Sakai et al. ............... 174/260 |
| 2010/0163168 | A1 | 7/2010 | Saita et al. |
| 2011/0240354 | A1 | 10/2011 | Furuhata et al. |

FOREIGN PATENT DOCUMENTS

| | | |
|---|---|---|
| JP | 2001-274034 A | 10/2001 |
| JP | 2002-016327 A | 1/2002 |
| JP | 2002-204071 A | 7/2002 |
| JP | 2002-217544 A | 8/2002 |
| JP | 2002-237683 A | 8/2002 |
| JP | 2010-114434 A | 5/2010 |
| JP | 2011-146545 A | 7/2011 |
| KR | 10-2011-0110043 A | 10/2011 |
| TW | 201034537 A1 | 9/2010 |
| WO | 2010/038489 A1 | 4/2010 |

OTHER PUBLICATIONS

Korean Industrial Property Office, Notification of Provisional Refusal issued in corresponding Korean application No. 10-2012-0109107, issued May 30, 2014.

Taiwan Patent Office, Notification for the Opinion of Examination issued in corresponding Taiwanese application No. 101135458, mailed May 19, 2015.

* cited by examiner

PRIOR ART

FIG. 16

PRIOR ART

US 9,167,702 B2

METHOD OF MANUFACTURING WIRING SUBSTRATE HAVING BUILT-IN COMPONENT

CROSS REFERENCE TO RELATED APPLICATIONS

The present application claims priority from Japanese Patent Application No. 2011-212967, which was filed on Sep. 28, 2011, the disclosure of which is herein incorporated by reference in its entirety.

BACKGROUND OF THE INVENTION

1. Field of the Invention

The present invention relates to a method of manufacturing a wiring substrate having a built-in component (hereinafter referred to as a "component-built-in wiring substrate") in which a component, such as a capacitor, is incorporated.

2. Description of Related Art

In association with a recent increasing tendency toward higher operation speed and higher functionality of semiconductor integrated circuit devices (IC chips) used as, for example, microprocessors of computers, the number of terminals have increased and the pitch between the terminals has tended to become narrower. Generally, a large number of terminals are densely arrayed on the bottom surface of an IC chip and are flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, there is fabricated a semiconductor package configured such that the IC chip is mounted on an IC chip mounting wiring substrate, and the semiconductor package is mounted on the motherboard. In the IC chip mounting wiring substrate which partially constitutes such a semiconductor package, in order to reduce switching noise of the IC chip and to stabilize supply voltage, provision of a capacitor is proposed. For example, a wiring substrate having the following configuration is conventionally proposed: a capacitor is embedded in a core substrate made of a polymeric material, and a build-up layer is formed on each of opposite sides of the core substrate (refer to, for example, Patent Documents 1 and 2).

Figure 15:
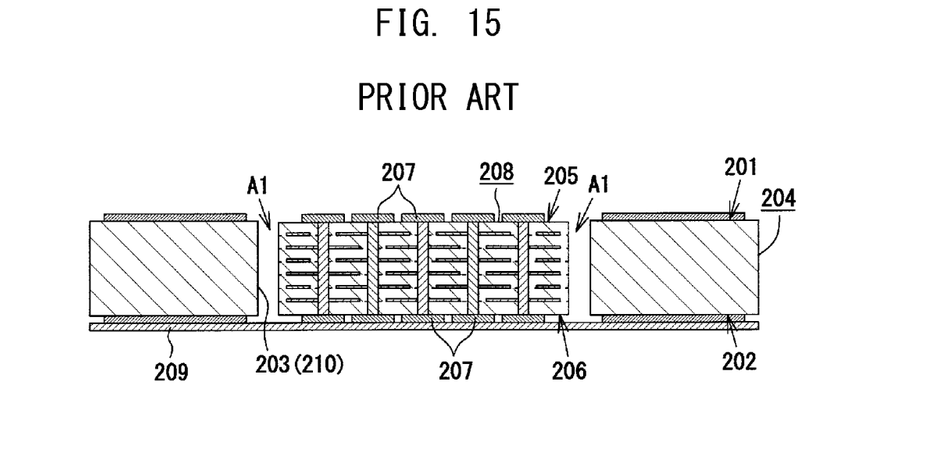
FIG. 15 is an explanatory view showing a step in a method of manufacturing a conventional wiring substrate.
Figure 16:
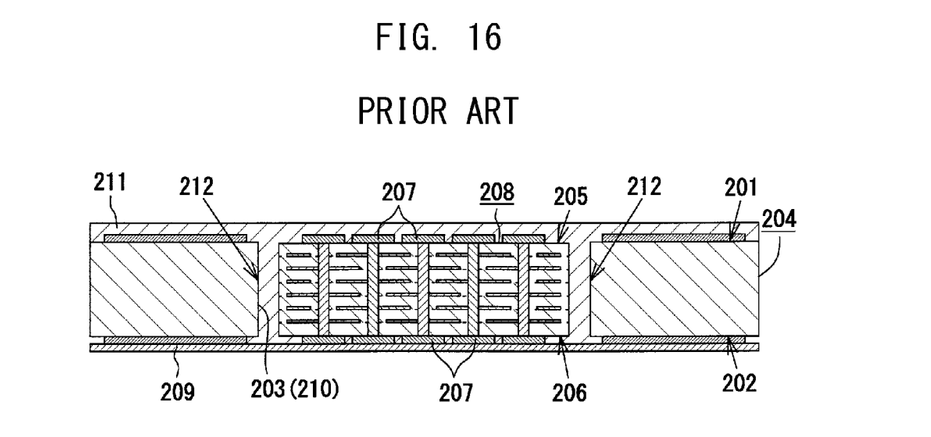
FIG. 16 is an explanatory view showing another step in the method of manufacturing the conventional wiring substrate.

An exemplary method of manufacturing the above-mentioned conventional wiring substrate is described below. First, there is prepared a core substrate 204 made of a polymeric resin and having an accommodation hole 203 which opens at both of a core main-surface 201 and a core back-surface 202 (see FIG. 15). Also prepared is a capacitor 208 having a plurality of surface electrodes 207 which are provided in a projecting condition on a capacitor main-surface 205 and a capacitor back-surface 206 (see FIG. 15). Next, a taping step is performed for affixing an adhesive tape 209 to the core back-surface 202, thereby sealing the opening of the accommodation hole 203 on a side toward the core back-surface side 202. Then, an accommodation step is performed for accommodating the capacitor 208 in the accommodation hole 203 such that the capacitor back-surface 206 is affixed to the adhesive surface of the adhesive tape 209 for temporary fixation (see FIG. 15). Next, a gap A1 between an inner wall surface 210 of the accommodation hole 203 and the side surfaces of the capacitor 208 is filled with a portion of a resin filler 211 in contact with the core main-surface 201; then, the resin filler 211 is cured and shrunk, thereby fixing the capacitor 208 in place (see FIG. 16). Then, after the adhesive tape 209 is removed, resin interlayer-insulation layers and conductor layers are alternatingly laminated on the core main-surface 201, thereby forming a main-surface-side build-up layer; similarly, resin interlayer-insulation layers and conductor layers are alternatingly laminated on the core back-surface 202, thereby forming a back-surface-side build-up layer. As a result, a desired wiring substrate is yielded.

RELATED ART DOCUMENTS

Patent Documents

Patent Document 1 is Japanese Patent Application Laid-Open (kokai) No. 2002-217544.
Patent Document 2 is Japanese Patent Application aid-Open (kokai) No. 2002-237683.

BRIEF SUMMARY OF THE INVENTION

However, generally, the above-mentioned structure often employs the core substrate 204 and the resin filler 211 which are formed from different types of resin materials; thus, the core substrate 204 and the resin filler 211 differ in thermal expansion coefficient. In many cases, the difference in thermal expansion coefficient between the core substrate 204 and the resin filler 211 raises a problem in adhesion between the inner wall surface 210 of the accommodation hole 203 and a contact surface 212 of the resin filler 211 in contact with the inner wall surface 210. Therefore, delamination occurs between the resin filler 211 and the core substrate 204, so that a manufactured wiring substrate becomes defective (i.e., reliability of the wiring substrate may deteriorate).

The present invention has been conceived in view of the above problem, and an object of the invention is to provide a method of manufacturing a component-built-in wiring substrate which exhibits excellent reliability, through improvement of adhesion between a resin filler and a core substrate.

A means for solving the above problem is a method of manufacturing a component-built-in wiring substrate, comprising: a core substrate preparation step of preparing a core substrate having a core main-surface and a core back-surface; an accommodation-hole forming step of forming, in the core substrate, an accommodation hole which opens at least on a side toward the core main-surface; a through-hole forming step of forming through-holes which extend through the core substrate in a direction of thickness of the core substrate; a plating-layer forming step of forming a plating layer on an inner wall surface of the accommodation hole and plating layers on inner wall surfaces of the through-holes, the plating layers on the inner wall surfaces of the through-holes each becoming through-hole conductors having a hollow; an accommodation step of accommodating, in the accommodation hole, a component having a component main-surface, a component back-surface, and component side-surfaces, in such a manner that the core main-surface and the component main-surface face the same direction; a resin charging step of filling a resin filler into a gap between the component side-surfaces and the inner wall surface of the accommodation hole and into the hollows; and a wiring-laminate forming step of alternatingly laminating a resin interlayer-insulation layer and a conductor layer on the core main-surface and the component main-surface so as to form a wiring laminate.

According to the method of manufacturing a component-built-in wiring substrate of the above-mentioned first means, in the plating-layer forming step, the plating layer is formed on the inner wall surface of the accommodation hole. As a result, when, in the resin charging step, the resin filler is charged into the gap between the component side-surfaces and the inner wall surface of the accommodation hole, the resin filler can reliably adhere to the inner wall surface of the accommodation hole. Therefore, since occurrence of delamination can be prevented, a component-built-in wiring substrate which exhibits excellent reliability can be yielded. Also, since in the plating-layer forming step there can be simultaneously performed a step of forming the plating layer on the inner wall surface of the accommodation hole and a step of forming plating layers on the inner wall surfaces of the through-holes, manufacturing costs can be reduced.

Furthermore, according to the above-described method, the plating layer formed on the inner wall surface of the accommodation hole can block off noise from the through-hole conductors. Also, the plating layer formed on the inner wall surface of the accommodation hole can prevent noise from the component from having adverse effects on the exterior of the component. Therefore, troubles caused by noise can be reduced. Also, since the plating layer can block off noise, the through-hole conductors and the component can be disposed close to each other. Therefore, the size of a component-built-in wiring substrate can be reduced through dense wiring in the wiring substrate.

The method of manufacturing a component-built-in wiring substrate will next be described.

In the core substrate preparation step, a core substrate having the core main-surface and the core back-surface surface is manufactured beforehand by a conventionally known method. In the subsequent accommodation-hole forming step, the accommodation hole which opens at least on the side toward the core main-surface is formed in the core substrate. That is, the accommodation hole may be a nonthrough-hole which opens only on the side toward the core main-surface, or a through-hole which opens on both sides toward the core main-surface and the core back-surface.

No particular limitation is imposed on material used to form the core substrate. However, preferably, the core substrate is formed primarily from a polymeric material. Specific examples of a polymeric material used to form the core substrate include EP resin (epoxy resin), PI resin (polyimide resin), BT resin (bismaleimide-triazine resin), and PPE resin (polyphenylene ether resin).

No particular limitation is imposed on the thickness of the core substrate. However, preferably, the thickness is 0.3 mm to 0.5 mm. If the thickness of the core substrate is less than 0.3 mm, the core substrate becomes excessively thin. As a result, the strength of the core substrate drops, and, in turn, the strength of the component-built-in wiring substrate drops. Meanwhile, if the thickness of the core substrate is in excess of 0.5 mm, the hollows become slender and deep. As a result, difficulty is encountered in filling the hollows with the resin filler.

In the subsequent through-hole forming step, the through-holes are formed in the core substrate in such a manner as to extend therethrough in the direction of the thickness thereof. In the subsequent plating-layer forming step, the plating layer is formed on the inner wall surface of the accommodation hole and the plating layers are formed on the inner wall surfaces of the through-holes, which become the through-hole conductors each having a hollow.

The plating layers can be formed from an electrically conductive metal material. Examples of a metal material used to form the plating layers include titanium, molybdenum, copper, chromium, cobalt, tungsten, nickel, tantalum, and niobium. Preferably, a good conductor, such as copper, is used to form the plating layers.

No particular limitation is imposed on the thickness of the plating layers. However, preferably, the plating layers have a thickness of 2 μm to 50 μm. If the thickness is less than 2 μm, the plating layers fail to sufficiently block off the above-mentioned noise. If the thickness is in excess of 50 μm, difficulty may be encountered in forming the plating layers.

Furthermore, preferably, after the plating-layer forming step and before the resin charging step, a surface roughening step is performed for roughening at least a surface of the plating layer formed on the inner wall surface of the accommodation hole and surfaces of the plating layers formed on the inner wall surfaces of the through-holes. By this procedure, irregularities are formed on the surfaces of the plating layers, thereby increasing the surface area. Therefore, when, in the resin charging step, the resin filler is filled into the gap between the component side-surfaces and the inner wall surface of the accommodation hole, the resin filler can reliably adhere to the inner wall surface of the accommodation hole.

The surface roughening step may be performed after the plating-layer forming step and before the accommodation step, or after the accommodation step and before the resin charging step. In the case of the surface roughening step being performed after the plating-layer forming step and before the accommodation step, the surface of the plating layer can be roughened without component interference. In the case of the surface roughening step being performed after the accommodation step and before the resin charging step, in addition to the surfaces of the plating layers, constituent elements (electrodes, etc.) on the surface of the component can also be roughened.

Particularly, in the case where the surfaces of the plating layers are roughened, preferably, the plating layers are a full-surface plating layer formed by plating on the entire surface of the core substrate, which includes the inner wall surface of the accommodation hole, the inner wall surfaces of the through-holes, the core main-surface, and the core back-surface. Through employment of such a plating feature, the surface area of the plating layers having roughened surfaces further increases. As a result, when the resin charging step is performed, the contact area between the plating layers and the resin filler further increases, so that adhesion between the resin filler and the core substrate is further enhanced. Furthermore, the plating layers can more reliably block off noise.

In the subsequent accommodation step, a component is accommodated in the accommodation hole in such a manner that the core main-surface and the component main-surface face the same direction. The component may be accommodated completely in the accommodation hole or in such a manner as to partially project from the opening of the accommodation hole. However, preferably, the component is accommodated completely in the accommodation hole. Through employment of such an accommodating condition, upon completion of the accommodation step, projection of the component from the opening of the accommodation hole can be prevented. Furthermore, when, in the subsequent wiring-laminate forming step, the resin interlayer-insulation layer is formed on the core main-surface and the component main-surface, the surface of the resin interlayer-insulation layer in contact with the core main-surface and the component main-surface can be flat so that dimensional accuracy of the component-built-in wiring substrate is improved.

A component to be accommodated in the accommodation hole in the accommodation step has a component main-surface, a component back-surface, and a component side-surfaces. The shape of the component can be determined arbitrarily. However, preferably, the component has a plate-like shape such that the main surface of the component is greater in area than the side surfaces. Through employment of such a shape, when the component is accommodated in the accommodation hole, the distance between the component side-surfaces and the inner wall surface of the accommodation hole reduces; thus, the resin filler to be filled into the accommodation hole can be reduced in volume. Also, preferably, as viewed in plane, the component can have a polygonal shape, which has a plurality of sides. Examples of polygonal shapes include a square shape, a triangular shape, and a hexagonal shape. Preferably, the component has a square shape as viewed in plane. The "square shape as viewed in plane" is not limited to a completely square shape as viewed in plane, but encompasses a square shape having chamfered corners and a square shape having partially curved sides.

Examples of a preferred components include capacitors, semiconductor integrated circuit devices (IC chips), and MEMS (Micro-Electro-Mechanical Systems) devices manufactured in a semiconductor manufacturing process.

Examples of a preferred capacitors include chip capacitors and capacitors having the following structure: a plurality of internal electrode layers are laminated via intervening dielectric layers, a plurality of via conductors are connected to the internal electrode layers, and a plurality of surface electrodes are connected to at least ends of the via conductors on the side toward the component main-surface. A preferred capacitor is a via-array-type capacitor, in which a plurality of via conductors are arranged in an array. Such a structure reduces inductance of a capacitor, so that high-speed power supply is possible for absorption of noise and smoothing of power supply. Also, reducing the size of a capacitor and, in turn, reducing the size of a component-built-in wiring substrate is facilitated. Furthermore, high capacitance is readily achieved for its small size, and power can be supplied in a more stabilized condition.

Examples of dielectric layers of a capacitor include ceramic dielectric layers, resin dielectric layers, and ceramic-resin dielectric layers.

No particular limitation is imposed on the internal electrode layers, the via conductors, and the surface electrodes. However, in the case of employment of ceramic dielectric layers, metallization conductors are preferred. Metallization conductors are formed through application of a conductive paste, which contains metal powder, by a conventionally known method, such as a metallization printing process, followed by firing.

In the subsequent resin charging step, the resin filler is filled into the gap between the component side-surfaces and the inner wall surface of the accommodation hole and into the hollows. Material for the resin filler may be selected as appropriate in view of insulating properties, resistance to heat, resistance to humidity, etc. Examples of a preferred polymeric material used to form the resin filler include epoxy resin, phenolic resin, polyurethane resin, silicone resin, and polyimide resin.

The resin charging step may include an insulation-layer affixing step of affixing a sheet-like insulation layer, which will become the resin filler, onto the core main-surface and the component main-surface, and a filling step of applying heat and pressure after the insulation-layer affixing step so as to charge a portion of the insulation layer into the gap between the component side-surfaces and the inner wall surface of the accommodation hole for fixing the component in place and to charge a portion of the insulation layer into the hollows for filling. Through employment of this procedure, since in the filling step, there can be simultaneously performed a step of fixing the component in place and a step of filling the hollows, manufacturing costs can be further reduced. Also, since a portion of the insulation layer, which will become the resin filler, is used to fix the component in place and to fill the hollows, the same resin material is used as a resin filler to be filled into the gap between the component side-surfaces and the inner wall surface of the accommodation hole and as a resin filler to be filled into the hollows. Therefore, there is no need to prepare different materials for the step of fixing the component in place and the step of filling the hollows. This reduces materials required for manufacturing a component-built-in wiring substrate, thereby lowering the cost of manufacture of the component-built-in wiring substrate. Furthermore, since a sheet-like insulation layer is used to form the resin filler, as compared with the case where the insulation layer is liquid, handling of the insulation layer is facilitated in filling the gap between the component side-surfaces and the inner wall surface of the accommodation hole with a portion of the insulation layer and in filling the hollows with a portion of the insulation layer.

The resin charging step may include a covering step of covering, with a cover member, an opening of the accommodation hole on a side toward the core main-surface or openings of the through-holes on the side toward the core main-surface; a first filling step of filling a filling material, which will become the resin filler, into the accommodation hole or the through-holes which are left open in the covering step; a removing step of removing, after the first filling step, the cover member from the side toward the core main-surface; an insulation-layer affixing step of affixing, after the removing step, a sheet-like insulation layer, which will become the resin filler, onto the core main-surface; and a second filling step of applying heat and pressure after the insulation-layer affixing step so as to charge a portion of the insulation layer into the accommodation hole or the through-holes which are not filled with the filling material. Since this allows use of respectively appropriate materials for the step of fixing the component in place and the step of filling the hollows, the resin charging step can be reliably performed. For example, if a liquid material is used as a filler, the filler can follow the profile of the gap between the component side-surfaces and the inner wall surface of the accommodation hole and the profiles of the hollows, so that the resin charging step can be reliably performed.

In the case where the component-built-in wiring substrate is a multi-piece-array wiring substrate configured such that a plurality of substrate formation regions, which are to become the individual wiring substrates, are arrayed in columns and rows as viewed in plane, preferably, in the covering step, the openings of the accommodation holes on the side toward the core main-surface are covered with the respective cover members; in the first filling step, the filling material is filled into the through-holes; and, in the second filling step, a portion of the insulation layer is charged into the accommodation holes. Generally, the accommodation hole for accommodating a component, such as a capacitor, therein exists only singly in a single substrate formation region. Meanwhile, the through-holes in which the through-hole conductors are formed respectively exist in a large quantity in a single substrate formation region. Thus, if the openings of the accommodation holes on the side toward the core main-surface are covered with the respective cover members, the number of cover members can be reduced as compared with the case where the openings of the through-holes are covered with the respective cover members, thereby facilitating manufacture of the component-built-in wiring substrate.

In the subsequent wiring-laminate forming step, a resin interlayer-insulation layer and a conductor layer are alternatingly laminated on the core main-surface and the component main-surface so as to form a wiring laminate. Since this allows formation of electric circuits in the wiring laminate, high functionality can be imparted to the component-built-in wiring substrate. Also, the wiring laminate is formed only on the core main-surface and the component main-surface; however, a laminate having a structure similar to that of the wiring laminate may also be formed on the core back-surface and the component back-surface. Such a configuration allows formation of electric circuits in not only in the wiring laminate formed on the core main-surface and the component main-surface but also in the laminate formed on the core back-surface and the component back-surface; therefore, far higher functionality can be imparted to the component-built-in wiring substrate.

Material for the resin interlayer-insulation layer may be selected as appropriate in view of insulating properties, resistance to heat, resistance to humidity, etc. Examples of a preferred polymeric material used to form the resin interlayer-insulation layer include thermosetting resins, such as epoxy resin, phenolic resin, polyurethane resin, silicone resin, and polyimide resin, and thermoplastic resins, such as polycarbonate resin, acrylic resin, polyacetal resin, and polypropylene resin.

Meanwhile, the conductor layer can be formed from an electrically conductive metal material. Examples of a metal material used to form the conductor layer include copper, silver, iron, cobalt, and nickel.

In the case where the plating layers constitute a full-surface layer, preferably, after the resin charging step and before the wiring-laminate forming step, a leveling step is performed for abrading the resin filler so as to level a surface of the resin filler with a surface of the plating layer formed on the core main-surface. This makes the surface of the resin filler flush with the surface of the plating layer formed on the core main-surface. Therefore, the resin interlayer-insulation layer in contact with the surface of the resin filler and with the surface of the plating layer can have a flat surface, thereby improving dimensional accuracy of the component-built-in wiring substrate.

In the leveling step, the resin filler is abraded for leveling the surface of the resin filler with the surface of the plating layer formed on the core main-surface. Examples of such an abrading method include a method in which a portion of the resin filler is mechanically removed, and a method in which a portion of the resin filler is chemically removed. Preferably, the leveling step employs the method in which a portion of the resin filler is mechanically removed. This is because, as compared with the method in which a portion of resin filler is chemically removed, the leveling step can be performed at low cost and with ease.

Furthermore, in the plating-layer forming step, electroless plating can be performed on the entire surface of the core substrate, which includes the inner wall surface of the accommodation hole, the inner wall surfaces of the through-holes, the core main-surface, and the core back-surface, and wherein the electroless plating is followed by electroplating.

Also, in the accommodation step and the resin charging step, the opening of the accommodation hole on the side toward the core back-surface can be covered with an adhesive tape having an adhesive surface.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A component-built-in wiring substrate according to a first embodiment of the present invention will next be described in detail with reference to the drawings.

Figure 1:
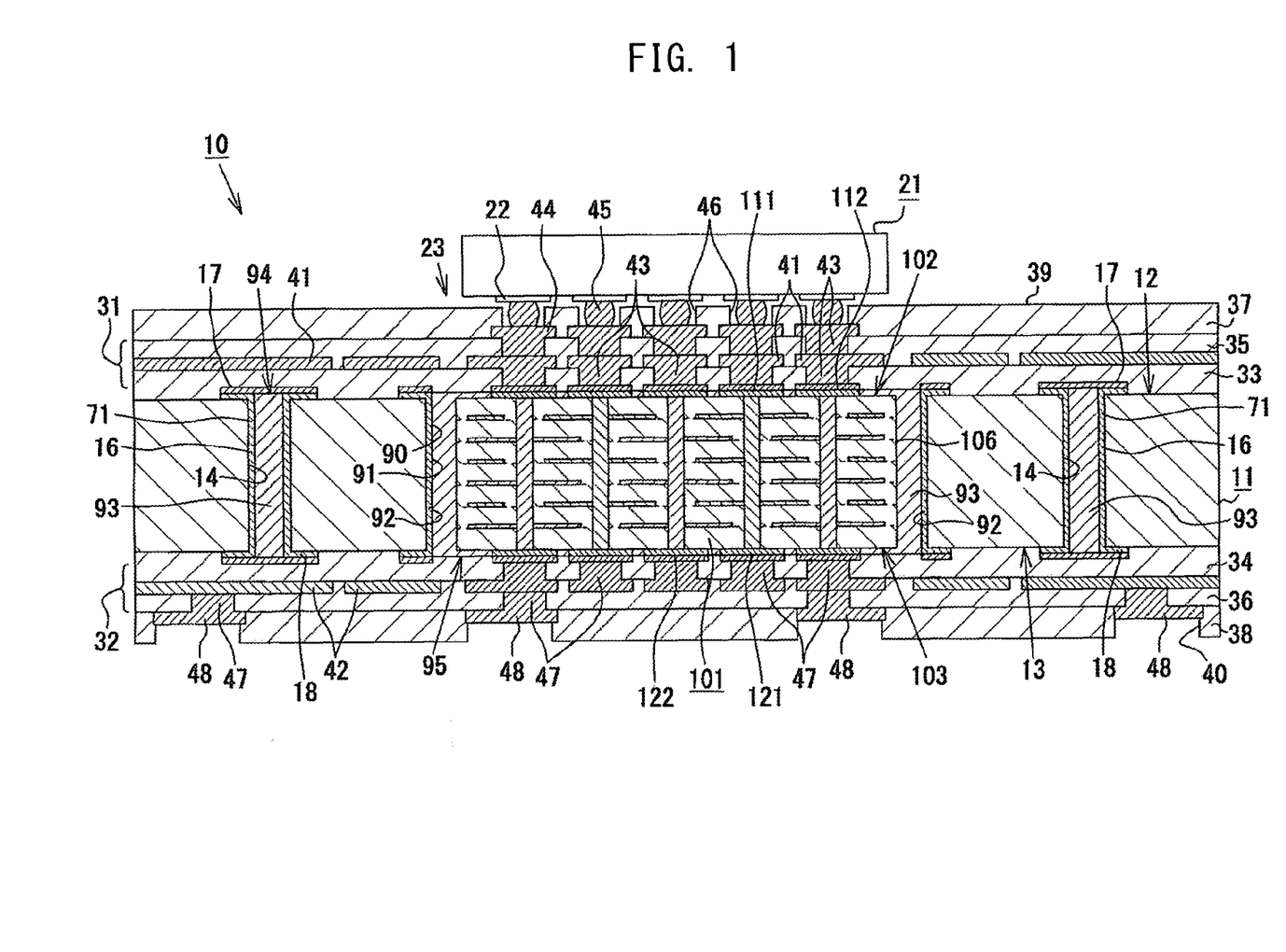
FIG. 1 is a schematic sectional view showing a wiring substrate according to a first embodiment of the present invention.

As shown in FIG. 1, a component-built-in wiring substrate (hereinafter, referred to as the "wiring substrate") 10 of the present embodiment is a wiring substrate for mounting an IC chip thereon. The wiring substrate 10 includes a substantially square, plate-like core substrate 11; a main-surface-side build-up layer 31 (a wiring laminate) formed on a core main-surface 12 (the upper surface in FIG. 1) of the core substrate 11; and a back-surface-side build-up layer 32 (a laminate) formed on a core back-surface 13 (the lower surface in FIG. 1) of the core substrate 11.

The core substrate 11 of the present embodiment has a substantially square shape as viewed in plane, measuring 25 mm length×25 mm width×0.4 mm thickness. The core substrate 11 is formed from a thermosetting resin (e.g., epoxy resin) and has a thermal expansion coefficient of about 10 ppm/° C. to 30 ppm/° C. (e.g., 18 ppm/° C.) in planar directions (X and Y directions). The thermal expansion coefficient of the core substrate 11 is the average of thermal expansion coefficients measured in a temperature range of 0° C. to the glass transition temperature (Tg).

Figure 6:
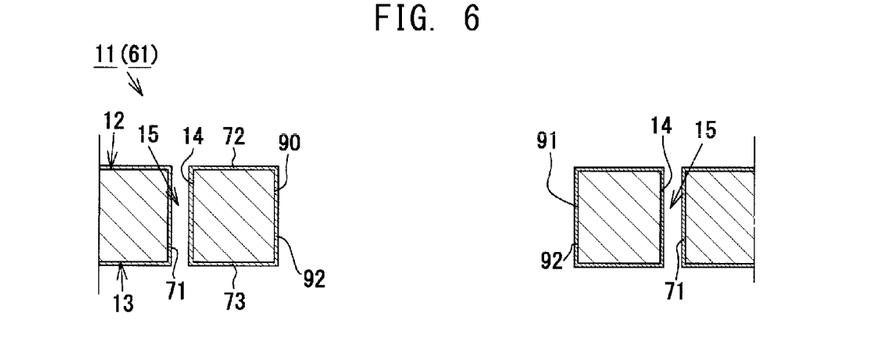
FIG. 6 is an explanatory view showing another step in the method of manufacturing the wiring substrate of the first embodiment.
Figure 7:
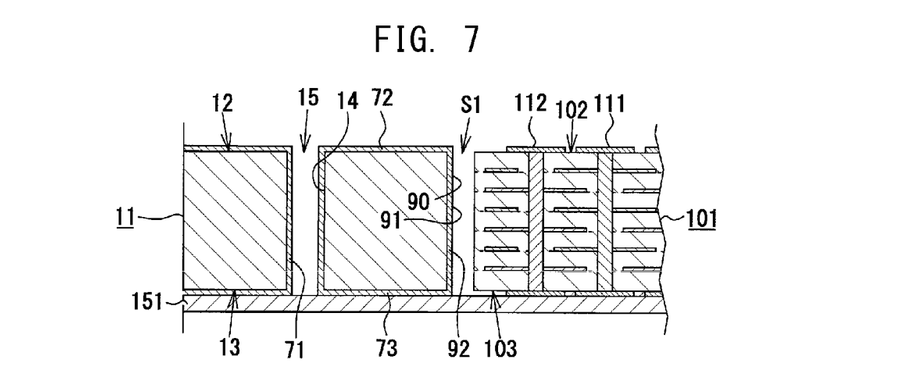
FIG. 7 is an explanatory view showing a further step in the method of manufacturing the wiring substrate of the first embodiment.

As shown in FIG. 1, the core substrate 11 has a plurality of through-holes 14 extending therethrough between the core main-surface 12 and a core back-surface 13. A through-hole conductor 16 having a hollow 15 (see FIGS. 6 and 7) is formed on the inner wall surface of each of the through-holes 14. The through-hole conductors 16 establish conductive connection between a side toward the core main-surface 12 and a side toward the core back-surface 13 of the core substrate 11. The hollows 15 are filled with a resin filler 93 formed from a polymeric material (in the present embodiment a thermosetting resin, such as epoxy resin). A main-surface-side conductor layer 17 of copper is formed in a predetermined pattern on the core main-surface 12 of the core substrate 11, and a back-surface-side conductor layer 18 of copper is formed in a predetermined pattern on the core back-surface 13 of the core substrate 11. The conductor layers 17 and 18 are electrically connected to the through-hole conductors 16.

As shown in FIG. 1, the core substrate 11 has one accommodation hole 90 which is square as viewed in plane and which opens in a central region of the core main-surface 12 and in a central region of the core back-surface 13. That is, the accommodation hole 90 is a through-hole. Also, a plating layer 92 is formed on an inner wall surface 91 of the accommodation hole 90 in such a manner as to cover the entire inner wall surface 91.

Figure 2:
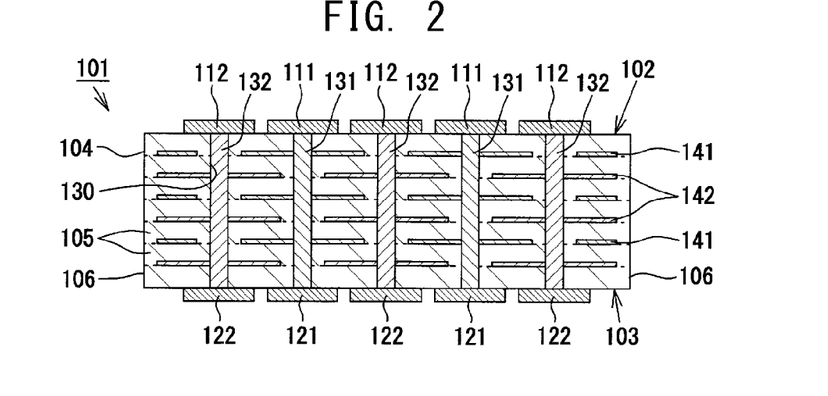
FIG. 2 is a schematic sectional view showing a ceramic capacitor incorporated in the wiring substrate of the first embodiment.
Figure 3:
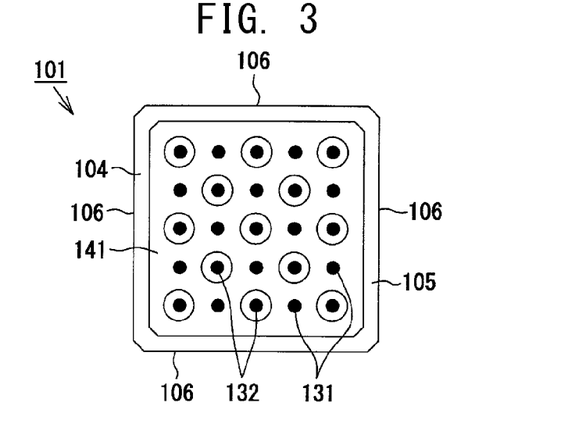
FIG. 3 is a schematic explanatory view showing connections with an internal layer of the ceramic capacitor of FIG. 2.
Figure 4:
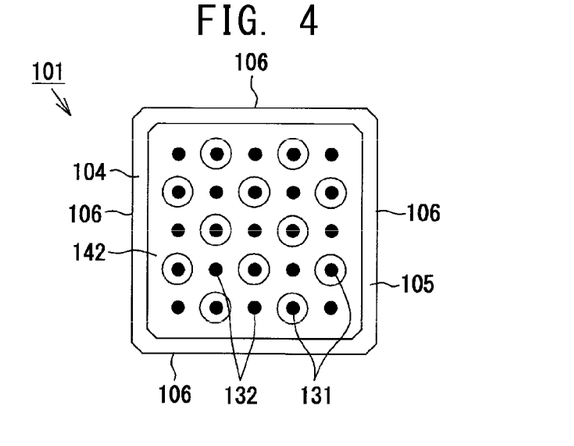
FIG. 4 is a schematic explanatory view showing connections with an internal layer of the ceramic capacitor of FIG. 2.

A ceramic capacitor 101 (component) shown in FIGS. 2 to 4 is accommodated in the accommodation hole 90 in an embedded condition. The ceramic capacitor 101 is accommodated in such a manner that the core main-surface 12 of the core substrate 11 and a capacitor main-surface 102 (the upper surface in FIG. 1) face the same direction and that the core back-surface 13 of the core substrate 11 and a capacitor back-surface 103 (the lower surface in FIG. 1) face the same direction. The ceramic capacitor 101 of the present embodiment is a plate-like component which has a square shape as viewed in plane, measuring 14.0 mm length×14.0 mm width× 0.4 mm thickness.

As shown in FIGS. 1 to 4, the ceramic capacitor 101 of the present embodiment is a so-called via-array-type capacitor. A ceramic sintered body 104 which partially constitutes the ceramic capacitor 101 has a thermal expansion coefficient of about 8 ppm/° C. to 12 ppm/° C., specifically, about 9.5 ppm/° C. The thermal expansion coefficient of the ceramic sintered body 104 is the average of thermal expansion coefficients measured in a temperature range of 30° C. to 250° C. The ceramic sintered body 104 has one capacitor main-surface 102 (the upper surface in FIG. 1), which is a component main-surface, one capacitor back-surface 103 (the lower surface in FIG. 1), which is a component back-surface, and four capacitor side-surfaces 106, which are component side-surfaces. The ceramic sintered body 104 has a structure in which power-supplying internal electrode layers 141 and grounding internal electrode layers 142 are alternatingly laminated via intervening ceramic dielectric layers 105. The ceramic dielectric layers 105 are formed from a sintered body of barium titanate, which is a high-dielectric-constant ceramic, and function as intervening dielectrics between the power-supplying internal electrode layers 141 and the grounding internal electrode layers 142. The power-supplying internal electrode layers 141 and the grounding internal electrode layers 142 contain nickel as a main component and are alternatingly disposed in the ceramic sintered body 104.

As shown in FIGS. 1 to 4, the ceramic sintered body 104 has a large number of via holes 130 formed therein. The via holes 130 extend through the ceramic sintered body 104 in the direction of thickness of the ceramic sintered body 104 and are arranged in an array (e.g., in lattice) throughout a planar area. The via holes 130 have a plurality of via conductors 131 and 132 which are respectively formed therein primarily from nickel and which establish communication between the capacitor main-surface 102 and the capacitor back-surface 103 of the ceramic sintered body 104. The power-supplying via conductors 131 extend through and electrically connect the power-supplying internal electrode layers 141. The grounding via conductors 132 extend through and electrically connect the grounding internal electrode layers 142. The power-supplying via conductors 131 and the grounding via conductors 132 are arranged in an array as viewed in plane. In the present embodiment, for the sake of convenience, the via conductors 131 and 132 are illustrated in an array of 5 columns×5 rows. In actuality, the via conductors are arrayed in a various number of columns and rows.

As shown in FIG. 2, a plurality of main-surface-side power-supplying electrodes 111 (surface electrodes) and a plurality of main-surface-side grounding electrodes 112 (surface electrodes) are provided in a projecting condition on the capacitor main-surface 102 of the ceramic sintered body 104. The main-surface-side grounding electrodes 112 are individually formed on the capacitor main-surface 102, but may be formed integrally. The main-surface-side power-supplying electrodes 111 are directly connected to end surfaces, on the side toward the capacitor main-surface 102, of the power-supplying via conductors 131, respectively. The main-surface-side grounding electrodes 112 are directly connected to end surfaces, on the side toward the capacitor main-surface 102, of the grounding via conductors 132, respectively. Also, a plurality of back-surface-side power-supplying electrodes 121 (surface electrodes) and a plurality of back-surface-side grounding electrodes 122 (surface electrodes) are provided in a projecting condition on the capacitor back-surface 103 of the ceramic sintered body 104. The back-surface-side grounding electrodes 122 are individually formed on the capacitor back-surface 103, but may be formed integrally. The back-surface-side power-supplying electrodes 121 are directly connected to end surfaces, on the side toward the capacitor back-surface 103, of the power-supplying via conductors 131, respectively. The back-surface-side grounding electrodes 122 are directly connected to end surfaces, on the side toward the capacitor back-surface 103, of the grounding via conductors 132, respectively. Accordingly, the power-supplying electrodes 111 and 121 electrically communicate with the power-supplying via conductors 131 and the power-supplying internal electrode layers 141, whereas the grounding electrodes 112 and 122 electrically communicate with the grounding via conductors 132 and the grounding electrode layers 142. The electrodes 111, 112, 121, and 122 are formed primarily from nickel and covered with unillustrated copper plating layers, respectively.

When voltage is applied between the power-supplying internal electrode layers 141 and the grounding internal electrode layers 142 through application of electricity from, for example, the side toward the electrodes 111 and 112, positive charges, for example, are accumulated on the power-supplying internal electrode layers 141, and negative charges, for example, are accumulated on the grounding internal electrode layers 142. As a result, the ceramic capacitor 101 functions as a capacitor. In the ceramic sintered body 104, the power-supplying via conductors 131 and the grounding via conductors 132 are arranged mutually adjacent to each other, and the direction of current flowing through the power-supplying via conductors 131 and the direction of current flowing through the grounding via conductors 132 are opposite to each other. As a result, an inductance component is reduced.

As shown in FIG. 1, the above-mentioned resin filler 93 is formed on the capacitor main-surface 102 of the ceramic capacitor 101. A portion of the resin filler 93 fills the gap between the inner wall surface 91 (in the present embodiment, the surface of the plating layer 92) of the accommodation hole 90 and the capacitor side-surfaces 106 of the ceramic capacitor 101. That is, the resin filler 93 has a function of fixing the ceramic capacitor 101 to the core substrate 11. The resin filler 93 in a completely cured condition has a thermal expansion coefficient of about 10 ppm/° C. to 60 ppm/° C., and in some embodiments is about 20 ppm/° C. The thermal expansion coefficient of the resin filler 93 in a completely cured condition is the average of thermal expansion coefficients measured in a temperature range of 30° C. to the glass transition temperature (Tg). Furthermore, the ceramic capacitor 101 is chamfered at four corners at a chamfer dimension of 0.55 mm or greater (in the present embodiment, at a chamfer dimension of 0.6 mm). As a result, when the resin filler 93 is deformed in association with variation of temperature, stress concentration on the corners of the ceramic capacitor 101 can be mitigated, whereby generation of cracking in the resin filler 93 can be prevented.

As shown in FIG. 1, the back-surface-side build-up layer 32 has a structure in which two resin interlayer-insulation layers 34 and 36 of a thermosetting resin (e.g, epoxy resin) and a conductor layer 42 of copper are alternatingly laminated. That is, the resin interlayer-insulation layers 34 and 36 are formed from a resin material having substantially the same composition as that of the resin filler 93. Thus, the resin interlayer-insulation layers 34 and 36 have the same thermal expansion coefficient as that of the resin filler 93 in a completely cured condition; i.e., about 10 ppm/° C. to 60 ppm/° C. The thermal expansion coefficient of the resin interlayer-insulation layers 34 and 36 is the average of thermal expansion coefficients measured in a temperature range of 30° C. to the glass transition temperature (Tg). The resin interlayer-insulation layers 34 and 36 have via conductors 47 formed therein by copper plating. Part of the via conductors 47 provided in the resin interlayer-insulation layers 34 and 36 are connected to the electrodes 121 and 122 of the ceramic capacitor 101. Also, pads 48 are formed in lattice on the lower surface of the second resin interlayer-insulation layer 36 and electrically connected to the conductor layer 42 via the respective via conductors 47. Furthermore, the lower surface of the resin interlayer-insulation layer 36 is substantially entirely covered with solder resist 38. Openings 40 are formed in the solder resist 38 at predetermined positions for allowing the pads 48 to be exposed therefrom.

As shown in FIG. 1, the main-surface-side build-up layer 31 has a structure substantially similar to that of the above-mentioned back-surface-side build-up layer 32. Specifically, the main-surface-side build-up layer 31 has a structure in which two resin interlayer-insulation layers 33 and 35 of a thermosetting resin (e.g., epoxy resin) and a conductor layer 41 of copper are alternatingly laminated. That is, the resin interlayer-insulation layers 33 and 35 are formed from a resin material having substantially the same composition as that of the resin filler 93. Thus, the resin interlayer-insulation layers 33 and 35 have the same thermal expansion coefficient as that of the resin filler 93 in a completely cured condition; i.e., about 10 ppm/° C. to 60 ppm/° C. The thermal expansion coefficient of the resin interlayer-insulation layers 33 and 35 is the average of thermal expansion coefficients measured in a temperature range of 30° C. to the glass transition temperature (Tg). The resin interlayer-insulation layers 33 and 35 have via conductors 43 formed therein by copper plating. Part of the via conductors 43 provided in the resin interlayer-insulation layers 33 and 35 are connected to the electrodes 111 and 112 of the ceramic capacitor 101. Also, terminal pads 44 are formed in an array on the upper surface of the second resin interlayer-insulation layer 35 and electrically connected to the conductor layer 41 via the respective via conductors 43. Furthermore, the upper surface of the resin interlayer-insulation layer 35 is substantially entirely covered with solder resist 37. Openings 46 are formed in the solder resist 37 at predetermined positions for allowing the terminal pads 44 to be exposed therefrom. A plurality of solder bumps 45 are disposed on the surfaces of the terminal pads 44, respectively.

As shown in FIG. 1, the solder bumps 45 are electrically connected to respective surface connection terminals 22 of an IC chip 21 (a semiconductor integrated circuit device). The IC chip 21 of the present embodiment is a plate-like device which has a square shape as viewed in plane, measuring 12.0 mm length×12.0 mm width×0.9 mm thickness, and is formed from silicon having a thermal expansion coefficient of about 3 ppm/° C. to 4 ppm/° C. (in the present embodiment about 3.5 ppm/° C.). The terminal pads 44 and the solder bumps 45 constitute an IC chip mounting region 23 where the IC chip 21 can be mounted. The IC chip mounting region 23 is provided on a surface 39 of the main-surface-side build-up layer 31.

Next, a method of manufacturing the wiring substrate 10 of the present embodiment will be described.

First, in a capacitor preparation step, the ceramic capacitor 101 is manufactured by a conventionally known method.

The ceramic capacitor 101 is manufactured as follows. Green sheets of ceramic are formed. A nickel paste for formation of internal electrodes is screen-printed on the green sheets, followed by drying. As a result, there are formed green sheets on which a power-supplying internal electrode zone, which will become the power-supplying internal electrode layer 141, is formed, and green sheets on which a grounding internal electrode zone, which will become the grounding internal electrode layer 142, is formed. Next, the green sheets on which the power-supplying internal electrode zone is formed and the green sheets on which the grounding internal electrode zone is formed are alternatingly laminated, followed by application of a pressing force in the direction of lamination. By this procedure, a green sheet laminate in which the green sheets are integrally laminated together is formed.

Furthermore, by use of a laser beam machine, a large number of the via holes 130 are formed in the green sheet laminate. By use of an unillustrated paste-press-filling apparatus, a nickel paste for formation of via conductors is filled into the via holes 130. Next, paste is printed on the upper surface of the green sheet laminate so as to form the electrodes 111 and 112 which cover the upper end surfaces of the via conductors. Also, the paste is printed on the lower surface of the green sheet laminate so as to form the electrodes 121 and 122 which cover the lower end surfaces of the via conductors.

Subsequently, the green sheet laminate is dried, thereby solidifying the electrodes 111, 112, 121, and 122 to a certain extent. Next, the green sheet laminate is debindered and then fired at a predetermined temperature for a predetermined time. As a result, barium titanate, and nickel contained in the paste are cofired, thereby forming the ceramic sintered body 104.

Next, electroless copper plating, at a thickness of about 10 μm, for example, is performed on the electrodes 111, 112, 121, 122 of the yielded ceramic sintered body 104. As a result, a copper plating layer is formed on the electrodes 111, 112, 121, and 122, whereby the ceramic capacitor 101 is completed.

In a core substrate preparation step, an intermediate product of the core substrate 11 is manufactured by a conventionally known method. Specifically, there is prepared a copper clad laminate 61 (see FIG. 5) in which copper foils 62 are affixed on respective opposite sides of a base material measuring 400 mm length×400 mm width×0.4 mm thickness. This is taken as an intermediate product of the core substrate 11. Notably, the intermediate product of the core substrate 11 is a multi-piece-array core substrate configured such that a plurality of regions which will become individual core substrates 11 are arrayed in columns and rows as viewed in plane.

Figure 5:
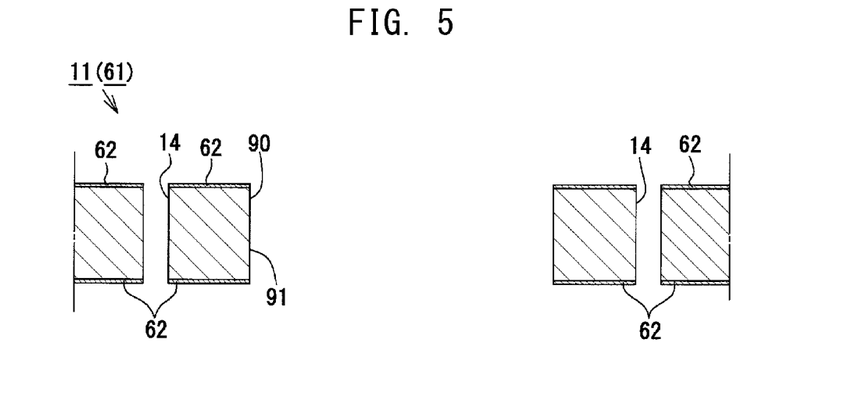
FIG. 5 is an explanatory view showing a step in a method of manufacturing the wiring substrate of the first embodiment.

In a subsequent accommodation-hole forming step, by use of a router, the accommodation hole 90 is formed in the core substrate 11 (the copper clad laminate 61) at a predetermined position (see FIG. 5). As viewed in plane, the accommodation hole 90 has a substantially square shape, 16.0 mm on a side, radiused at four corners at a radius of 3 mm. In a through-hole forming step, the through-holes 14 where the respective through-hole conductors 16 are to be formed are formed in the core substrate 11 (the copper clad laminate 61) at predetermined positions through drilling by use of a drilling machine (see FIG. 5). The through-holes 14 each have a circular cross section having an inside diameter of 100 μm.

In a subsequent plating-layer forming step, electroless copper plating is performed on the entire surface of the core substrate 11 which encompasses the inner wall surface 91 of the accommodation hole 90, the inner wall surfaces of the through-holes 14, the core main-surface 12, and the core back-surface 13, followed by copper electroplating. As a result, the plating layer 92 is formed on the inner wall surface 91 of the accommodation hole 90, and plating layers 71, which will become the through-hole conductors 16, are formed on the inner wall surfaces of the through-holes 14, respectively (see FIG. 6). Furthermore, a plating layer 72, which will become the main-surface-side conductor layer 17, is formed on the core main-surface 12, and a plating layer 73, which will become the back-surface-side side conductor layer 18, is formed on the core back-surface 13 (see FIG. 6). The plating layers 71 to 73 and 92 constitute a full-surface plating layer formed by plating on the entire surface of the core substrate 11 which encompasses the inner wall surface 91 of the accommodation hole 90, the inner wall surfaces of the through-holes 14, the core main-surface 12, and the core back-surface 13.

In a subsequent accommodation step, an opening of the accommodation hole 90 on the side toward the core back-surface 13 is sealed by means of a removable adhesive tape 151. The adhesive tape 151 is supported on a support table (not shown). Next, by use of a mounting apparatus (product of Yamaha Motor Co., Ltd.), the ceramic capacitor 101 is accommodated in the accommodation hole 90 such that the core main-surface 12 and the capacitor main-surface 102 face the same direction, whereas the core back-surface 13 and the capacitor back-surface 103 face the same direction (see FIG. 7). At this time, the capacitor back-surface 103 of the ceramic capacitor 101 is affixed to the adhesive surface of the adhesive tape 151 for temporary fixation.

In a subsequent surface roughening step, roughening (CZ process) is performed on the surface of the plating layer 92 formed on the inner wall surface 91 of the accommodation hole 90 and the surfaces of the plating layers 71 formed on the inner wall surfaces of the respective through-holes 14. In the surface roughening step, roughening is also performed on the surface of the plating layer 72 formed on the core main-surface 12. Furthermore, in the surface roughening step, roughening is also performed on the surfaces of the electrodes 111 and 112 of the ceramic capacitor 101. The surface roughening step is performed after the plating-layer forming step and before the resin charging step; more specifically, after the accommodation step and before a resin charging step. Upon completion of the surface roughening step, a cleaning step is performed for cleaning the surface of the plating layer 92, the surfaces of the plating layers 71, the surface of the plating layer 72, and the surfaces of the electrodes 111 and 112. Also, if necessary, a coupling process may be performed on the side toward the core main-surface 12 by use of a silane coupling agent (product of Shin-Etsu Chemical Co., Ltd.).

Figure 8:
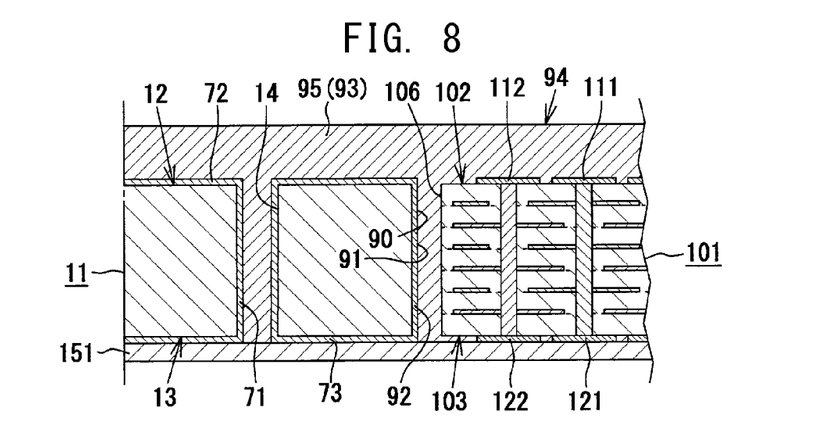
FIG. 8 is an explanatory view showing a still further step in the method of manufacturing the wiring substrate of the first embodiment.

In the subsequent resin charging step, the resin filler 93 is charged into the gap between the inner wall surface 91 of the accommodation hole 90 (in the present embodiment, the surface of the plating layer 92) and the capacitor side-surfaces 106 of the ceramic capacitor 101 and into the hollows 15 (see FIG. 8). More specifically, first, an insulation-layer affixing step is performed for affixing a sheet-like insulation layer 95, which will become the resin filler 93, onto the core main-surface 12 and the capacitor main-surface 102. The insulation layer 95 of the present embodiment is a build-up material which contains epoxy resin as a main component. The thickness of the insulation layer 95 may be to such an extent as to be able to provide a sufficient volume for filling a gap S1 shown in FIG. 7 and the hollows 15 and is, in the present embodiment, about 50 μm to 200 μm. After the insulation-layer affixing step, a filling step is performed for applying heat and pressure to the insulation layer 95. Specifically, by use of a vacuum thermocompression press (not shown), the insulation layer 95 is heated to a temperature of 140° C. to 150° C. under a vacuum and pressed against the core main-surface 12 and the capacitor main-surface 102 at 0.75 MPa for 120 seconds. At this time, a portion of the insulation layer 95 is charged into the gap S1 between the inner wall surface 91 (the surface of the plating layer 92) of the accommodation hole 90 and the capacitor side-surfaces 106, thereby filling the gap S1. At the same time, a portion of the insulation layer 95 is charged into the hollows 15, thereby filling the hollows 15. Subsequently, a heating process, such as curing, is performed, whereby the insulation layer 95 (the resin filler 93) is cured, thereby fixing the ceramic capacitor 101 in place in the accommodation hole 90.

Figure 9:
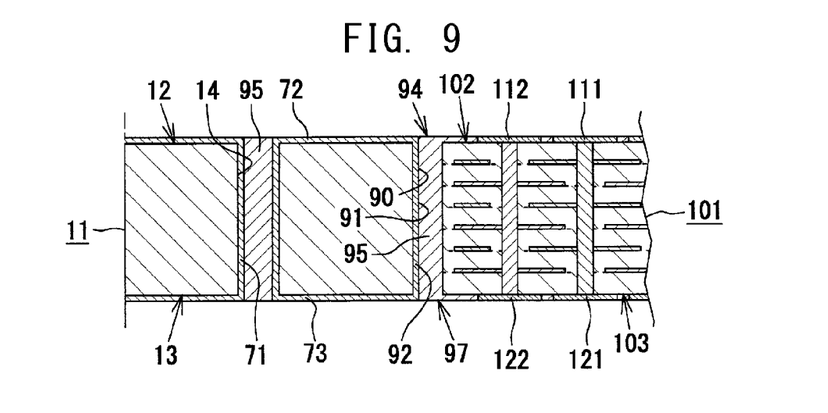
FIG. 9 is an explanatory view showing yet another step in the method of manufacturing the wiring substrate of the first embodiment.

In a subsequent leveling step, the resin filler 93 is abraded for leveling the surface 94 of the resin filler 93 with the surface of the plating layer 72 formed on the core main-surface 12 (see FIG. 9). The leveling step is performed after the resin charging step and before a wiring-laminate forming step. Specifically, by use of a belt sander, the surface 94 of the resin filler 93 located above the surface of the plating layer 72 is abraded so as to lower the level of the surface 94. As a result, a portion of the resin filler 93 is mechanically removed, whereby the surface of the plating layer 72 and the surfaces of the electrodes 111 and 112 are exposed. Subsequently, the adhesive tape 151 is removed from the side toward the core back-surface 13 and the capacitor back-surface 103.

Figure 10:
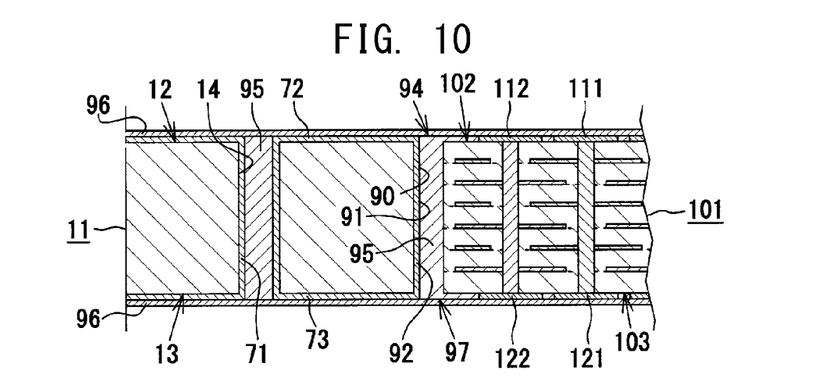
FIG. 10 is an explanatory view showing another step in the method of manufacturing the wiring substrate of the first embodiment.

After the leveling step, by means of electroless copper plating being performed according to a conventionally known method, a plating layer 96 is formed on the surface 94 of the resin filler 93, the surface of the plating layer 72, and the surfaces of the electrodes 111 and 112 (see FIG. 10). Also, by means of electroless copper plating being performed according to a conventionally known method, the plating layer 96 is formed on a surface 97 of the resin filler 93, the surface of the plating layer 73, and the surfaces of the electrodes 121 and 122 (see FIG. 10). Next, the plating layer 96 is etched by, for example, a subtractive process for patterning. Specifically, dry films are laminated respectively on the plating layer 96 on the side toward the core main-surface 12 and on the plating layer 96 on the side toward the core back-surface 13. The dry films are subjected to exposure and development, thereby forming the dry films into respectively predetermined patterns. In this condition, unnecessary portions of the plating layers 72, 73, and 96 are etched away. Subsequently, the dry films are removed. As a result, the main-surface-side conductor layer 17 is formed on the core main-surface 12, and the back-surface-side conductor layer 18 is formed on the core back-surface 13. At this time, portions of the plating layer 96 on the side toward the core main-surface 12 collectively become a covering plating layer which covers the end surfaces of the through-hole conductors 16 and the end surface of the resin filler 93 on the side toward the core main-surface 12, and portions of the plating layer 96 on the side toward the core back-surface 13 collectively become a covering plating layer which covers the end surfaces of the through-hole conductors 16 and the end surface of the resin filler 93 on the side toward the core back-surface 13.

In the subsequent wiring-laminate forming step, by a conventionally known method, the main-surface-side build-up layer 31 is formed on the core main-surface 12 and the capacitor main-surface 102, and the back-surface-side build-up layer 32 is formed on the core back-surface 13 and the capacitor back-surface 103. Specifically, first, a thermosetting epoxy resin is affixed to the core main-surface 12 and the capacitor main-surface 102 (i.e., the surface 94 of the resin filler 93, the surface of the plating layer 72, and the surfaces of the electrodes 111 and 112) thereby forming the resin interlayer-insulation layer 33. Also, a thermosetting epoxy resin is affixed to the core back-surface 13 and the capacitor back-surface 103 (i.e., the surface 97 of the resin filler 93, the surface of the plating layer 73, and the surfaces of the electrodes 121 and 122) thereby forming the resin interlayer-insulation layer 34. In place of a thermosetting epoxy resin, a photosensitive epoxy resin, an insulating resin, or a liquid crystalline polymer (LCP) may be affixed.

Furthermore, by use of YAG laser or carbon dioxide gas laser, laser drilling is performed at positions where the via conductors 43 and 47 are to be formed. Specifically, via holes are formed through the resin interlayer-insulation layer 33 so as to expose the surfaces of the electrodes 111 and 112. Also, via holes are formed through the resin interlayer-insulation layer 34 so as to expose the surfaces of the electrodes 121 and 122. Next, by a conventionally known method, copper electroplating is performed so as to form the via conductors 43 and 47 in the respective via holes and to form the conductor layer 41 on the resin interlayer-insulation layer 33, and the conductor layer 42 on the resin interlayer-insulation layer 34.

Next, a thermosetting epoxy resin is affixed onto the resin interlayer-insulation layers 33 and 34 so as to form the resin interlayer-insulation layers 35 and 36, respectively, which have via holes at positions where the via conductors 43 and 47 are to be formed. In place of a thermosetting epoxy resin, a photosensitive epoxy resin, an insulating resin, or liquid crystalline polymer may be affixed. In this case, by use of, for example, a laser beam machine, via holes are formed at positions where the via conductors 43 and 47 are to be formed. Next, by a conventionally known method, copper electroplating is performed so as to form the via conductors 43 and 47 in the respective via holes, the terminal pads 44 on the resin interlayer-insulation layer 35, and the pads 48 on the resin interlayer-insulation layer 36.

Next, a photosensitive epoxy resin is applied onto the resin interlayer-insulation layers 35 and 36, followed by curing for forming the solder resists 37 and 38, respectively. Next, the solder resists 37 and 38 on which respectively predetermined masks are disposed are subjected to exposure and development, thereby being patterned to have the openings 46 and 40, respectively.

In a subsequent solder-bump forming step, a solder paste is applied by printing onto the terminal pads 44 formed on the outermost resin interlayer-insulation layer 35. Next, the wiring substrate to which the solder paste is applied by printing is placed in a reflow oven and then heated to a temperature 10° C. to 40° C. higher than the melting point of solder. At this point of time, the applied solder paste melts into the solder bumps 45 which each have a hemispheric shape and are adapted to mount the IC chip 21. The wiring substrate in this condition is a multi-piece-array wiring substrate configured such that a plurality of regions which will become individual wiring substrates 10 are arrayed in columns and rows as viewed in plane. The multi-piece-array wiring substrate is divided into a large number of individual products (i.e., the wiring substrates 10).

Subsequently, the IC chip 21 is mounted on the IC chip mounting region 23 of the main-surface-side build-up layer 31, which partially constitutes the wiring substrate 10. At this time, the surface connection terminals 22 of the IC chip 21 are aligned with the corresponding solder bumps 45. The solder bumps 45 are heated to a temperature of about 220° C. to 240° C. so as to be reflowed, whereby the solder bumps 45 are joined to the corresponding surface connection terminals 22. Accordingly, the wiring substrate 10 and the IC chip 21 are electrically connected to each other. As a result, the IC chip 21 is mounted on the IC chip mounting region 23 (see FIG. 1).

Therefore, the present embodiment can yield at least the following effects.

(1) In the present embodiment, the core substrate 11 and the resin filler 93 are formed from different types of resin materials and thus differ in thermal expansion coefficient. Thus, the difference in thermal expansion coefficient between the core substrate 11 and the resin filler 93 often causes a problem with respect to adhesion between the resin filler 93 and the inner wall surface 91 of the accommodation hole 90. Accordingly, delamination may arise between the resin filler 93 and the core substrate 11. In order to cope with the problem, according to the present embodiment, in the plating-layer forming step, the plating layer 92 is formed on the inner wall surface 91 of the accommodation hole 90, and, in the surface roughening step, the surface of the plating layer 92 is roughened. As a result, when, in the resin charging step, the resin filler 93 is filled into the gap S1 between the inner wall surface 91 of the accommodation hole 90 and the capacitor side-surfaces 106, the resin filler 93 can reliably adhere to the inner side wall 91 of the accommodation hole 90. Therefore, since the occurrence of delamination or the like can be prevented, the wiring substrate 10 having excellent reliability can be yielded. Also, in the plating-layer forming step, since there can be simultaneously performed the step of forming the plating layer 92 on the inner wall surface 91 of the accommodation hole 90 and the step of forming the plating layers 71 on the inner wall surfaces of the respective through-holes 14, manufacturing costs can be reduced.

Furthermore, in the present embodiment, the plating layer 92 formed on the inner wall surface 91 of the accommodation hole 90 can block off noise from the through-hole conductors 16. Also, the plating layer 92 formed on the inner wall surface 91 of the accommodation hole 90 can prevent noise from the ceramic capacitor 101 from having adverse effect on the exterior of the ceramic capacitor 101. Therefore, troubles caused by noise can be reduced. Accordingly, electric power can be reliably supplied to the IC chip 21, whereby the IC chip 21 can be operated satisfactorily, and erroneous operation of the IC chip 21 can be prevented. Also, since the plating layer 92 can block off noise, the through-hole conductors 16 and the ceramic capacitor 101 can be disposed close to each other. Therefore, the size of the wiring substrate 10 can be reduced through dense wiring in the wiring substrate 10.

(2) In the filling step of the present embodiment, since there are simultaneously performed the step of fixing the ceramic capacitor 101 in place and the step of filling the hollows 15, the number of manufacturing steps can be reduced. Therefore, the cost of manufacturing the wiring substrate 10 can be further reduced. Also, since a portion of the insulation layer 95 (the resin filler 93) is used to fix the ceramic capacitor 101 in place and to fill the hollows 15, the same resin material is used as the insulation layer 95 to be filled into the gap S1 between the capacitor side-surfaces 106 and the inner wall surface 91 of the accommodation hole 90 and as the insulation layer 95 to be filled into the hollows 15. Therefore, there is no need to prepare different materials for the step of fixing the ceramic capacitor 101 in place and the step of filling the hollows 15. This reduces materials required for manufacturing the wiring substrate 10, thereby lowering the cost of manufacture of the wiring substrate 10. Furthermore, since the sheet-like insulation layer 95 is used to form the resin filler 93, as compared with the case where the insulation layer 95 is liquid, handling of the insulation layer 95 is facilitated in filling the gap S1 between the capacitor side-surfaces 106 and the inner wall surface 91 of the accommodation hole 90 with a portion of the insulation layer 95 and in filling the hollows 15 with a portion of the insulation layer 95.

(3) In the present embodiment, since the IC chip mounting region 23 is located within a region located immediately above the ceramic capacitor 101, the IC chip 21 mounted on the IC chip mounting region 23 is supported by the ceramic capacitor 101, which has high rigidity and low thermal expansion coefficient. Accordingly, since, in the IC chip mounting region 23, the main-surface-side build-up layer 31 is unlikely to deform, the IC chip 21 mounted on the IC chip mounting region 23 can be more stably supported. Therefore, there can be prevented the occurrence of cracking and defective connection in the IC chip 21 which could otherwise result from large thermal stress. Thus, the following non-limiting list of IC chips can be used as the IC chip 21: a large IC chip at 10 mm square or greater, which is subjected to a large influence of thermal stress in association with an increase in stress (strain) stemming from thermal expansion difference and to severe thermal shock in the course of use stemming from a large amount of heat generation, and a low-k (low dielectric constant) IC chip, which is said to be fragile.

A second embodiment of the present invention will next be described with reference to the drawings. The second embodiment will be described, centering on points of difference from the first embodiment.

Figure 11:
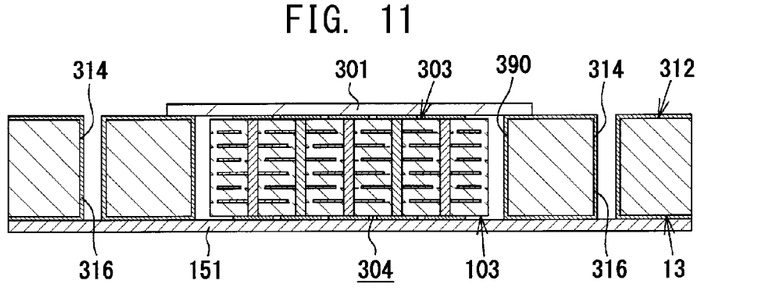
FIG. 11 is an explanatory view showing a step in a method of manufacturing a wiring substrate according to a second embodiment of the present invention.

The present embodiment differs from the above-described first embodiment in the resin charging step. Specifically, the resin charging step of the present embodiment includes a covering step, a first filling step, a removing step, an insulation-layer affixing step, and a second filling step. First, in the covering step, the opening of an accommodation hole 390 on the side toward a core main-surface 312 is covered with a cover member 301 (see FIG. 11). The cover member 301 in the present embodiment is a plate-like member having a square shape as viewed in plane, measuring 18.0 mm length× 18.0 mm width×2.0 mm thickness. The cover member 301 is formed from, for example, a composite material in which cloth of inorganic fibers (e.g., glass cloth) is contained in a resin material (in the present embodiment, epoxy resin).

Figure 12:
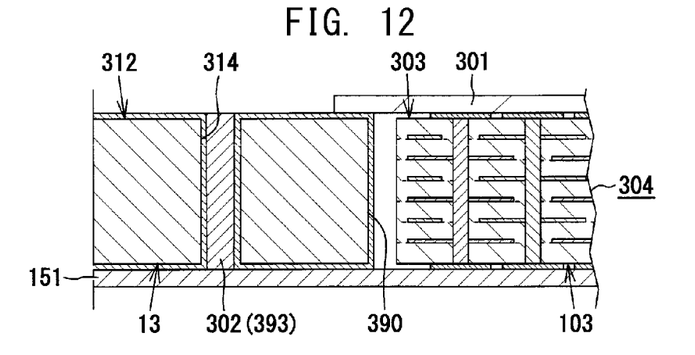
FIG. 12 is an explanatory view showing another step in the method of manufacturing the wiring substrate of the second embodiment.

In the subsequent first filling step, a filling material 302, which will become a resin filler 393, is filled into the accommodation hole 390 and/or the through-holes 314 which are left open in the covering step (see FIG. 12). Specifically, by use of a dispenser (product of Asymtek), the liquid filling material 302 is filled into hollows 315 of through-hole conductors 316 formed in the respective through-holes 314 (see FIG. 11). In place of use of the dispenser, printing may be employed for filling the filling material 302 into the hollows 315. After the first filling step, the removing step is performed for removing the cover member 301 from the side toward the core main-surface 312.

Figure 13:
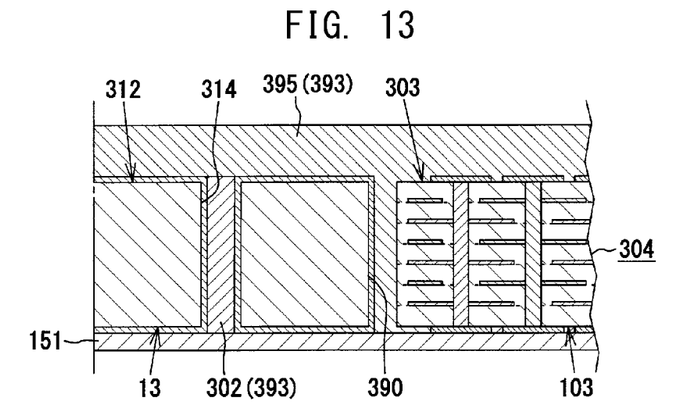
FIG. 13 is an explanatory view showing a further step in the method of manufacturing the wiring substrate of the second embodiment.

In the insulation-layer affixing step subsequent to the removing step, a sheet-like insulation layer 395, which will become the resin filler 393, is affixed onto the core main-surface 312 and a capacitor main-surface 303. The thickness of the insulation layer 395 may be to such an extent as to be able to provide a sufficient volume for filling the gap in the accommodation hole 390 and is, in the present embodiment, about 50 μm to 200 μm. After the insulation-layer affixing step, the second filling step is performed for applying heat and pressure to the insulation layer 395. Specifically, by use of a vacuum thermocompression press (not shown), the insulation layer 395 is heated to a temperature of 140° C. to 150° C. under a vacuum and pressed against the core main-surface 312 and the capacitor main-surface 303 at 0.75 MPa for 120 seconds. At this time, a portion of the insulation layer 395 is charged into the accommodation hole 390 and/or the through-holes 314 which are not filled with the filling material 302 (see FIG. 13). Subsequently, a heating process (such as curing) is performed, whereby the filling material 302 is cured, and the insulation layer 395 is also cured, thereby fixing the ceramic capacitor 304 in place in the accommodation hole 390.

Therefore, according to the present embodiment, since respectively appropriate materials can be used for the step of fixing the ceramic capacitor 304 in place and the step of filling the hollows 315, the resin charging step can be reliably performed. For example, since a liquid material is used as the filling material 302, the filling material 302 well follows the profiles of the hollows 315, so that the resin charging step can be reliably performed.

The above-described embodiments may be modified as follows.

In the above-described embodiments, the surface roughening step is performed after the accommodation step and before the resin charging step. However, the surface roughening step may be performed at different timing. For example, the surface roughening step may be performed after the plating-layer forming step and before the accommodation step.

In the above-described second embodiment, in the covering step, the opening of the accommodation hole 390 on the side toward the core main-surface 312 is covered with the cover member 301; in the first filling step, the filling material 302 is filled into the through-holes 314; and in the second filling step, a portion of the insulation layer 395 is charged into the accommodation hole 390. However, the following procedure may be employed: in the covering step, the openings of the through-holes 314 on the side toward the core main-surface 312 are covered with the cover member 301; in the first filling step, the filling material 302 is filled into the accommodation hole 390; and in the second filling step, a portion of the insulation layer 395 is charged into the through-holes 314.

Figure 14:
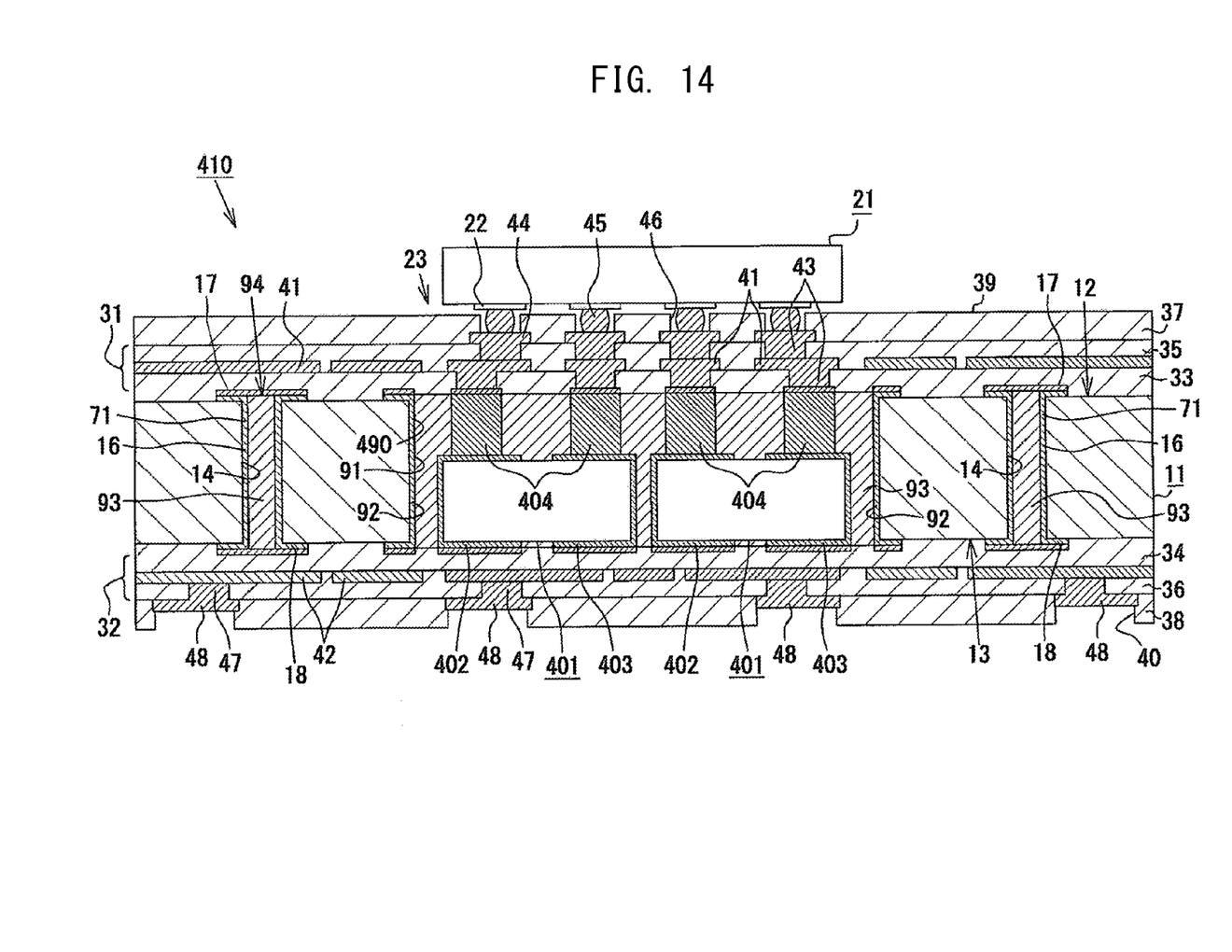
FIG. 14 is a schematic sectional view showing a wiring substrate according to a further embodiment of the present invention.

In the above-described embodiments, the via-array-type ceramic capacitors 101 and 304 are used as components to be accommodated in the accommodation holes 90 and 390, respectively. However, as shown in a wiring substrate 410 of FIG. 14, chip capacitors 401 may be used as components to be accommodated in an accommodation hole 490. The chip capacitor 401 has, for example, a structure in which a power-supplying internal electrode layer and a grounding internal electrode layer are alternatingly laminated with a dielectric layer intervening therebetween. The chip capacitor 401 has a power-supplying electrode 402 and a grounding electrode 403 provided at respective opposite side surfaces thereof. The power-supplying electrode 402 is connected to the power-supplying internal electrode layers and is connected to the corresponding via conductor 43 via a corresponding projecting conductor 404 which is provided in a projecting condition on the power-supplying electrode 402. The grounding electrode 403 is connected to the grounding internal electrode layers and is connected to the corresponding via conductor 43 via a corresponding projecting conductor 404 which is provided in a projecting condition on the grounding electrode 403. The projecting conductors 404 are circular columnar conductors (copper posts) formed by copper electroplating. Two chip capacitors 401 are accommodated in the accommodation hole 490. However, only one chip capacitor may be accommodated, or three or more chip capacitors may be accommodated in the accommodation hole 490. Also, an IC chip, a DRAM, an SRAM, etc. may be used as a component(s) to be accommodated in the accommodation hole.

DESCRIPTION OF REFERENCE NUMERALS

10: component-built-in wiring substrate (wiring substrate)
11: core substrate
12, 312: core main-surface
13: core back-surface
14, 314: through-hole
15, 315: hollow
16, 316: through-hole conductor
31: main-surface-side build-up layer serving as wiring laminate
33, 35: resin interlayer-insulation layer
41: conductor layer
71, 72, 73, 92: plating layer
90, 390, 490: accommodation hole
91: inner wall surface of accommodation hole
93, 393: resin filler
94: surface of resin filler
95, 395: insulation layer
101, 304: ceramic capacitor used as component
102, 303: capacitor main-surface serving as component main-surface
103: capacitor back-surface serving as component back-surface
106: capacitor side-surfaces serving as component side-surfaces
301: cover member
302: filling material
401: chip capacitor used as component
S1: gap

What is claimed is:

1. A method of manufacturing a component-built-in wiring substrate, comprising:
a core substrate preparation step of preparing the core substrate having a core main-surface and a core back-surface;
an accommodation-hole forming step of forming, in the core substrate, the accommodation hole which opens at least on a side toward the core main-surface;
a through-hole forming step of forming through-holes which extend through the core substrate in a direction of thickness of the core substrate;
a plating-layer forming step of forming a plating layer on an inner wall surface of the accommodation hole and plating layers on inner wall surfaces of the through-holes, the plating layers on the inner wall surfaces of the through-holes each becoming through-hole conductors having a hollow;
an accommodation step of accommodating, in the accommodation hole, a component having a component main-surface, a component back-surface, and component side-surfaces, in such a manner that the core main-surface and the component main-surface face the same direction;
a resin charging step of filling a resin filler into a gap between the component side-surfaces and the inner wall surface of the accommodation hole and into hollows, including:
a covering step of covering, with a cover member, an opening of the accommodation hole on a side toward the core main-surface or openings of the through-holes on the side toward the core main-surface;
a first filling step of filling a filling material, which will become the resin filler, into the accommodation hole or the through-holes which are left open in the covering step;
a removing step of removing, after the first filling step, the cover member from the side toward the core main-surface;
an insulation-layer affixing step of affixing, after the removing step, an insulation layer, which will become the resin filler, onto the core main-surface; and
a second filling step of applying heat and pressure after the insulation-layer affixing step so as to charge a portion of the insulation layer into the accommodation hole or the through-holes which are not filled with the filling material; and
a wiring-laminate forming step of alternatingly laminating a resin interlayer-insulation layer and a conductor layer on the core main-surface and the component main-surface so as to form a wiring laminate.

2. The method of manufacturing a component-built-in wiring substrate according to claim 1, further comprising:
a surface roughening step for roughening, after the plating-layer forming step and before the resin charging step, at least a surface of the plating layer formed on the inner wall surface of the accommodation hole and surfaces of the plating layers formed on the inner wall surfaces of the through-holes.

3. The method of manufacturing a component-built-in wiring substrate according to claim 2, wherein the surface roughening step is performed after the plating-layer forming step and before the accommodation step.

4. The method of manufacturing a component-built-in wiring substrate according to claim 2, wherein the surface roughening step is performed after the accommodation step and before the resin charging step.

5. The method of manufacturing a component-built-in wiring substrate according to claim 1, wherein, in the accommodation step and the resin charging step, the opening of the accommodation hole on the side toward the core back-surface is covered with an adhesive tape having an adhesive surface.

6. A method of manufacturing a multi-piece-array wiring substrate configured such that a plurality of substrate formation regions, which are to become individual wiring substrates, are arrayed in columns and rows as viewed in plane, comprising:
- a core substrate preparation step of preparing the core substrate having a core main-surface and a core back-surface;
- an accommodation-hole forming step of forming, in the core substrate, the accommodation hole in each of the plurality of substrate formation regions, each accommodation hole opening at least on a side toward the core main-surface;
- a through-hole forming step of forming through-holes which extend through the core substrate in a direction of thickness of the core substrate;
- a plating-layer forming step of forming a plating layer on an inner wall surface of each accommodation hole and plating layers on inner wall surfaces of the through-holes, the plating layers on the inner wall surfaces of the through-holes each becoming through-hole conductors having a hollow;
- an accommodation step of accommodating, in each accommodation hole, a respective component having a component main-surface, a component back-surface, and component side-surfaces, in such a manner that the core main-surface and each component main-surface face the same direction;
- a resin charging step of filling a resin filler into a gap between the component side-surfaces and the inner wall surface of each accommodation hole and into hollows, including:
  - a covering step of covering, with a respective cover member, an opening of each accommodation hole on a side toward the core main-surface;
  - a first filling step of filling a filling material, which will become the resin filler, into the through-holes;
  - a removing step of removing, after the first filling step, the cover member from the side toward the core main-surface;
  - an insulation-layer affixing step of affixing, after the removing step, an insulation layer, which will become the resin filler, onto the core main-surface; and
  - a second filling step of applying heat and pressure after the insulation-layer affixing step so as to charge a portion of the insulation layer into each accommodation hole; and
- a wiring-laminate forming step of alternatingly laminating a respective resin interlayer-insulation layer and a respective conductor layer on the core main-surface and each component main-surface so as to form a respective wiring laminate in each of the plurality of substrate formation regions.

7. A method of manufacturing a component-built-in wiring substrate, comprising:
- a core substrate preparation step of preparing the core substrate having a core main-surface and a core back-surface;
- an accommodation-hole forming step of forming, in the core substrate, the accommodation hole which opens at least on a side toward the core main-surface;
- a through-hole forming step of forming through-holes which extend through the core substrate in a direction of thickness of the core substrate;
- a plating-layer forming step of forming a plating layer on an inner wall surface of the accommodation hole and plating layers on inner wall surfaces of the through-holes, the plating layers on the inner wall surfaces of the through-holes each becoming through-hole conductors having a hollow;
- an accommodation step of accommodating, in the accommodation hole, a component having a component main-surface, a component back-surface, and component side-surfaces, in such a manner that the core main-surface and the component main-surface face the same direction;
- a resin charging step of filling a resin filler into a gap between the component side-surfaces and the inner wall surface of the accommodation hole and into hollows;
- a wiring-laminate forming step of alternatingly laminating a resin interlayer-insulation layer and a conductor layer on the core main-surface and the component main-surface so as to form a wiring laminate; and
- a leveling step for abrading, after the resin charging step and before the wiring-laminate forming step, the resin filler so as to level a surface of the resin filler with a surface of the plating layer formed on the core main-surface;
- wherein the plating layers are a full-surface plating layer formed by plating on an entire surface of the core substrate, which includes the inner wall surface of the accommodation hole, the inner wall surfaces of the through-holes, the core main-surface, and the core back-surface.

8. A method of manufacturing a component-built-in wiring substrate comprising:
- a core substrate preparation step of preparing the core substrate having a core main-surface and a core back-surface;
- an accommodation-hole forming step of forming, in the core substrate, the accommodation hole which opens at least on a side toward the core main-surface;
- a through-hole forming step of forming through-holes which extend through the core substrate in a direction of thickness of the core substrate;
- a plating-layer forming step of forming a plating layer on an inner wall surface of the accommodation hole and plating layers on inner wall surfaces of the through-holes, the plating layers on the inner wall surfaces of the through-holes each becoming through-hole conductors having a hollow;
- an accommodation step of accommodating, in the accommodation hole, a component having a component main-surface, a component back-surface, and component side-surfaces, in such a manner that the core main-surface and the component main-surface face the same direction;
- a resin charging step of filling a resin filler into a gap between the component side-surfaces and the inner wall surface of the accommodation hole and into hollows; and
- a wiring-laminate forming step of alternatingly laminating a resin interlayer-insulation layer and a conductor layer on the core main-surface and the component main-surface so as to form a wiring laminate;
- wherein, in the plating-layer forming step, electroless plating is performed on an entire surface of the core substrate, which includes the inner wall surface of the accommodation hole, the inner wall surfaces of the through-holes, the core main-surface, and the core back-surface, and wherein the electroless plating is followed by electroplating.

* * * * *